United States Patent
Hook et al.

(10) Patent No.: US 6,194,702 B1
(45) Date of Patent: *Feb. 27, 2001

(54) METHOD OF FORMING A COMPLEMENTARY ACTIVE PIXEL SENSOR CELL

(75) Inventors: Terence B. Hook, Jericho Center; Jeffrey B. Johnson, Essex Junction, both of VT (US); Hon-Sum P. Wong, Chappaqua, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 09/290,755

(22) Filed: Apr. 13, 1999

Related U.S. Application Data

(62) Division of application No. 08/920,182, filed on Aug. 25, 1997.

(51) Int. Cl.$^7$ .................................................. H01L 31/00
(52) U.S. Cl. ...................... 250/214 A; 257/290; 257/292
(58) Field of Search ............................ 250/214 A, 214.1; 257/290, 291, 292, 257, 258, 236, 369

(56) References Cited

U.S. PATENT DOCUMENTS

| | | | |
|---|---|---|---|
| 5,587,596 | 12/1996 | Chi et al. | 257/223 |
| 5,625,210 | 4/1997 | Lee et al. | 257/292 |
| 5,721,425 | * 2/1998 | Merrill | 250/214.1 |
| 5,903,021 | * 5/1999 | Lee et al. | 257/292 |
| 6,026,964 | * 2/2000 | Hook et al. | 257/292 |

* cited by examiner

Primary Examiner—Que T. Le
Assistant Examiner—Thanh X. Luu
(74) Attorney, Agent, or Firm—DeLio & Peterson, LLC; Peter W. Peterson; Eugene I. Shkurko

(57) ABSTRACT

The present invention is a complementary active pixel sensor cell and method of making and using the same. The complementary active pixel sensor cell approximately doubles the available signal for a given quanta of light. The device of the present invention utilizes the holes produced by impinging photons in a complementary active pixel sensor cell circuit. Two active pixel sensor cell circuits, an NFET circuit and complementary PFET circuit are created for use with a photodiode. The NFET circuit captures electron current. The PFET circuit captures hole current. The sum of the currents is approximately double that of conventional active pixel sensor circuits using similarly sized photodiode regions.

10 Claims, 8 Drawing Sheets

METHOD OF FORMING A COMPLEMENTARY ACTIVE PIXEL SENSOR CELL

This is a divisional of application Ser. No. 08/920,182 filed on Aug. 25, 1997, now U.S. Pat. No. 6,026,964, issued Feb. 22, 2000.

BACKGROUND OF THE INVENTION

1. Field of the Invention

The present invention relates to active pixel sensors and in particular an active pixel sensor which approximately doubles the available signal for a given quanta of light.

2. Description of Related Art

A conventional Active Pixel Sensor (APS) cell consists of an np diode in the p-substrate, an NFET transfer device, a source-follower amplifying transistor, a pre-charge transistor, and a bit switch transistor. Electron-hole pairs are produced in the diode by impinging photons. The electrons are collected in the pre-charged n region of the diode, and eventually transferred to the source-follower gate for amplification. A p-type pinning layer is often included at the surface of the diode.

In APS cells, pn diodes collect electrons generated by incoming light. The electron charge is amplified and the signal-to-noise ratio is proportional to the charge level. Holes generated by the light are not collected and recombine in either of the p-type terminals.

FIG. 1a illustrates a schematic cross-section of the photodiode and the transfer gate. FIG. 1b illustrates the schematic of the circuit embodied in each Active Pixel Sensor device 10. The number of electrons collected determines the level of gate drive on the source-follower transistor 12. The source potential is transferred down the column through the bit switch 14, where it can be processed appropriately for video imaging. In the conventional cell 10, holes equal in number to the electrons are created and are shunted to the substrate 16 creating a substrate current which exits the cell through the ground line.

Bearing in mind the problems and deficiencies of the prior art, it is therefore an object of the present invention to provide an active pixel cell device for video imaging whereby the size of the pixel cell is reduced.

It is another object of the present invention to provide an active pixel sensor which produces an output signal and a complementary output signal.

It is another object of the present invention to provide an active pixel sensor device with improved common-mode mode noise rejection.

It is another object of the present invention to provide an active pixel sensor device with improved signal-to-noise ratio.

It is another object of the present invention to provide an active pixel sensor device with reduced fixed pattern noise.

It is another object of the present invention to provide an active pixel sensor device with a reduced size collection area.

A further object of the invention is to provide an active pixel sensor device which approximately doubles the output current relative to conventional active pixel sensor devices.

It is yet another object of the present invention to provide an active pixel cell device which virtually eliminates substrate current.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, an active pixel sensor cell comprising: a photosensitive device; a first device coupled to the photosensitive device; and a second device coupled to the photosensitive device; wherein the photosensitive device generates charges in response to electromagnetism impinging on the photosensitive device, the first device draws a first type of generated charge away from the photosensitive device, and the second device draws a second type of generated charge away from the photosensitive device.

In another aspect, the device of the present invention is directed to an active pixel sensor cell comprising: a photosensitive device; a first active pixel sensor circuit adapted to create a path for electron flow from the photosensitive device; and a second active pixel sensor circuit adapted to create a path for hole flow from the photosensitive device.

In another aspect, the present invention is directed to a method of using an active pixel sensor device comprising the steps of: (a) providing an active pixel sensor cell device comprising: a photosensitive device; a first active pixel sensor circuit adapted to create a path for electron flow from the photosensitive device; a second active pixel sensor circuit adapted to create a path for hole flow from the photosensitive device; (b) collecting light with the photosensitive device; (c) creating a first current of electron flow from the photosensitive device to the first active pixel sensor circuit; and (d) creating a second current of hole flow from the photosensitive device to the second active pixel sensor circuit.

In another aspect, the present invention is directed to a method of using an active pixel sensor device comprising the steps of: (a) providing an active pixel sensor cell device comprising: a photosensitive device; a first active pixel sensor circuit adapted to create a path for electron flow from the photosensitive device comprising: a first transfer device in series with the photosensitive device adapted to transfer electrons from the photosensitive device; a first pre-charge device adapted to collect electrons which flow through the first transfer device; a first source-follower device adapted to amplify the electrons collected by the first pre-charged device; and a first bit switch device adapted to control an output signal; and a second active pixel sensor circuit adapted to create a path for hole flow from the photosensitive device comprising: a second transfer device in series with the photosensitive device adapted to transfer holes from the photosensitive device; a second pre-charge device adapted to collect holes which flow through the second transfer device; a second source-follower device adapted to amplify the holes collected by the second pre-charged device; and a second bit switch device adapted to control a second output signal; (b) collecting light with the photosensitive device; (c) creating electron-hole pairs by impinging photons; (d) transferring electrons from the photosensitive device with the first transfer device; (e) collecting electrons in the first circuit pre-charge device; (f) amplifying electrons with the first circuit source-follower device; (g) switching electrons with the first bit switch device in order to control a first output current; (h) transferring holes from the photosensitive device with the first transfer device; (i) collecting holes in the second circuit pre-charge device; (j) amplifying holes with the second circuit source-follower device; (k) switching the holes with the second bit switch device in order to control a second output current; and (l) processing the first and second output current signals for video imaging.

In yet another aspect, the present invention is directed to a method of making an active pixel sensor device comprising the steps of: (a) providing an n type wafer substrate; (b) creating an insulating region having first and second sides; (c) creating a first isolation region in the n-epitaxy layer and on the first side of the insulating region; (d) creating a second isolation region in the n-epitaxy layer and positioned on the second side of the insulating region; (e) implanting a p-diode region in the n-epitaxy region positioned on the first side of the insulating region; (f) implanting a p-body region in the substrate on the second side of the insulating region; (g) implanting an n-type diode in a portion of the p-diode region; (h) depositing gate material on the n-epitaxy layer for defining first and second gate regions, the first gate region aligned over an edge of the p-diode region, the second gate region aligned over an edge of the n diode region; (i) implanting a p pinning layer in the n-epitaxy layer and between the first and second gate regions; (j) implanting a p+ source/drain in the epitaxy layer and between the first isolation region and the first gate region; and (k) implanting an n+ source/drain in the n-epitaxy layer and between the second isolation region and the second gate region.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1b is a schematic diagram of the prior art active pixel sensor cell of FIG. 1a.

FIG. 2b is a schematic diagram of the active pixel sensor cell of FIG. 2a.

DESCRIPTION OF THE PREFERRED EMBODIMENT(S)

Figure 1A:
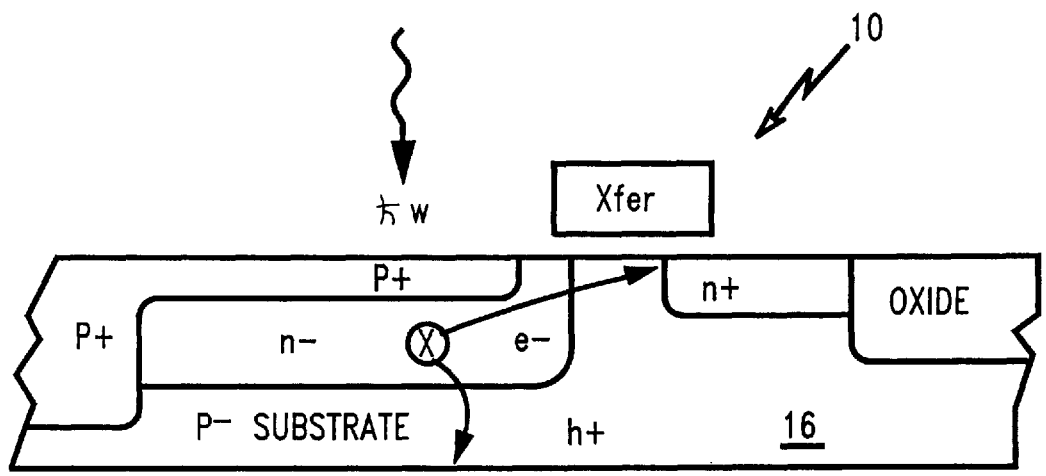
FIG. 1a is a cross-sectional view of a prior art active pixel sensor cell.

In describing the preferred embodiment of the present invention, reference will be made herein to FIGS. 1–4 of the drawings in which like numerals refer to like features of the invention. Features of the invention are not necessarily shown to scale in the drawings.

Figure 2A:
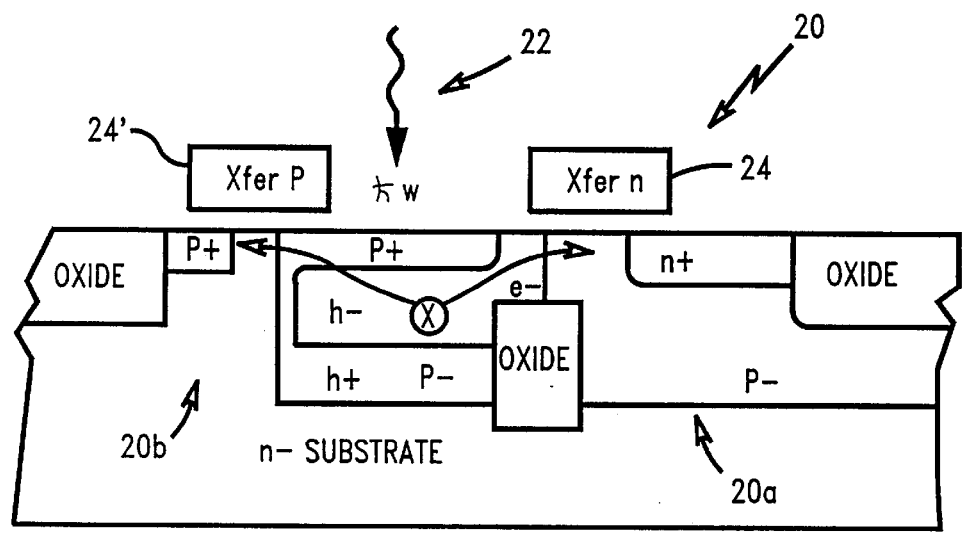
FIG. 2a is a cross-sectional view of the active pixel sensor cell of the present invention.
Figure 2B:
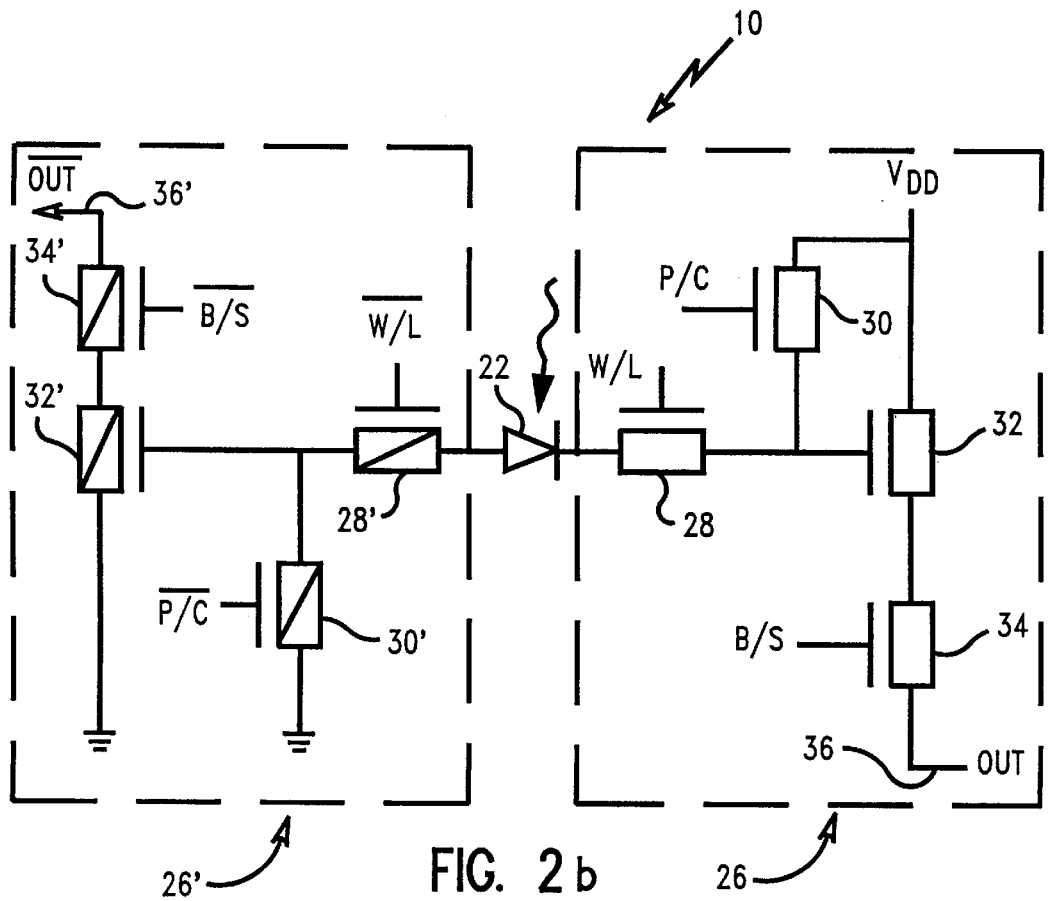

FIG. 2a illustrates a schematic cross-section of the complementary active pixel cell device 20 of the present invention with a photodiode or photosensitive device 22 and two transfer gates 24 and 24'. The photodiode 22 collects photons which create electron-hole pairs. The electrons are captured in a first active pixel sensor circuit on the n side 20a of the photodiode 22 and isolated from the p side 20b of the photodiode 22. FIG. 2b illustrates the schematic of the circuit embodied of the complementary pixel sensor device 20 of the present invention. The first active pixel sensor circuit 26 comprises a word-line transistor or NFET transfer device 28, an NFET pre-charge device 30, an NFET source-follower device 32 and an NFET bit switch device 34 which creates an output signal 36. The holes are captured in a complementary or second active pixel sensor circuit 26' on the p side of the photodiode 22. The second active pixel sensor circuit is isolated from the starting n-type silicon substrate. The second active pixel sensor circuit 26' comprises a PFET transfer device 28', a PFET pre-charge device 30', PFET source-follower device 32' and a PFET bit switch device 34' which creates an output signal 36' approximately equal and opposite to the output signal 36 of the NFET circuit which it complements.

Figure 3A:
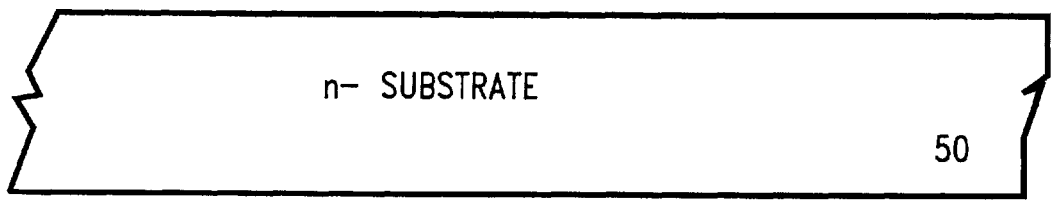
FIGS. 3a–j illustrate the steps for producing the complementary active pixel sensor cell of the present invention.
Figure 3B:
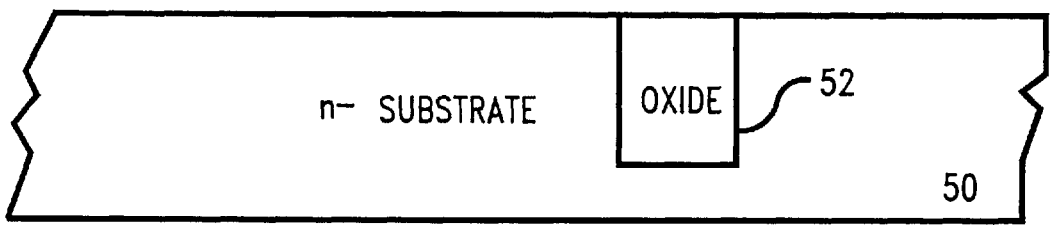
Figure 3C:
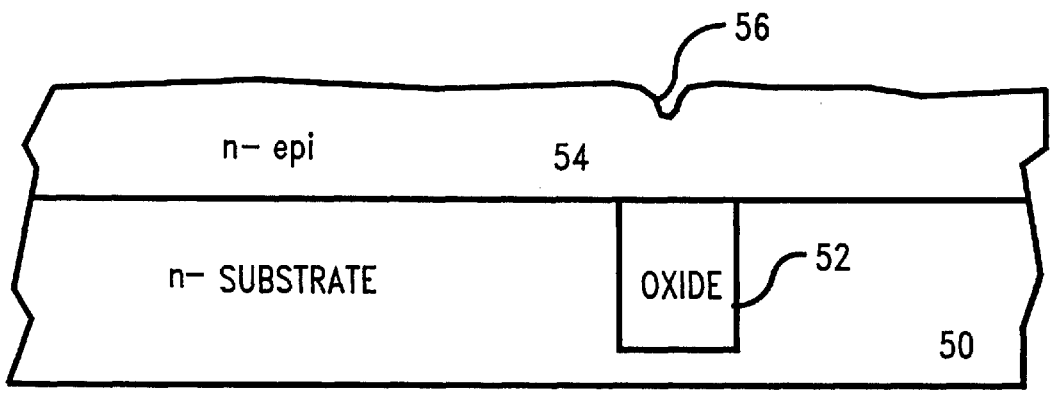
Figure 3D:
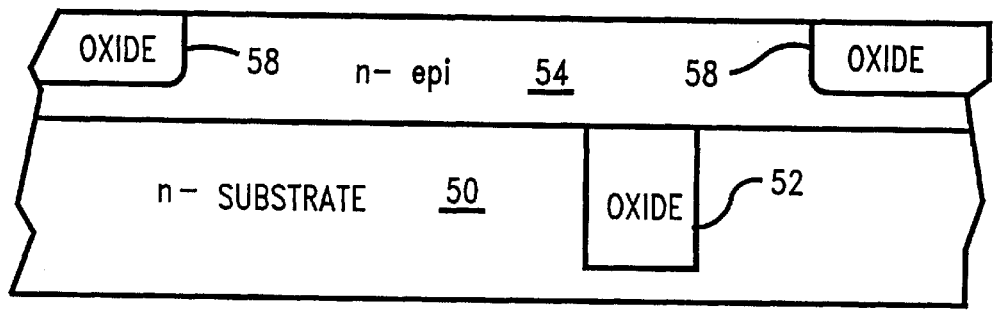
Figure 3E:
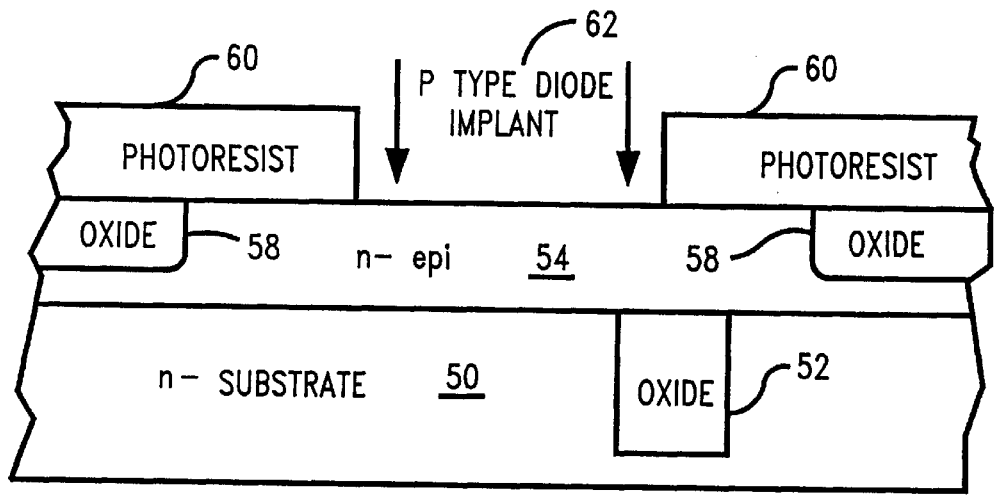
Figure 3F:
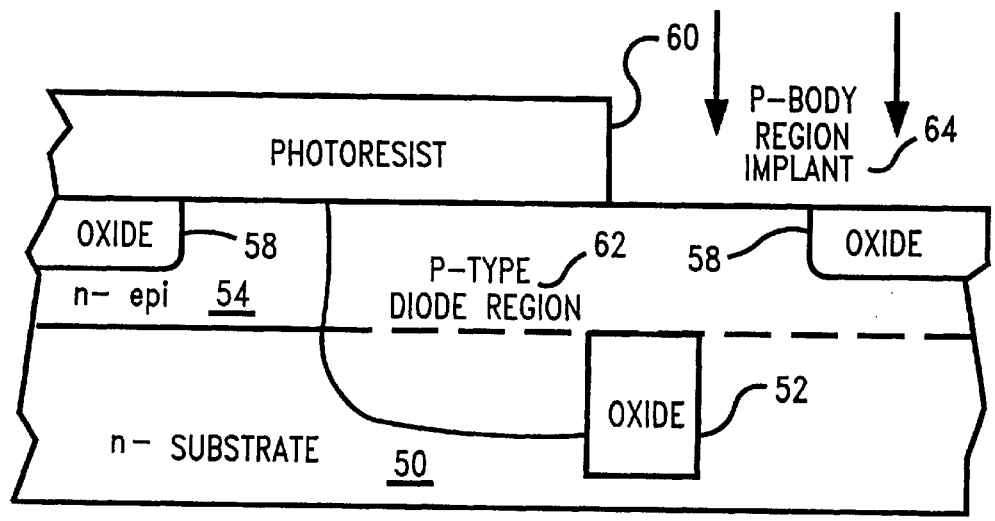
Figure 3G:
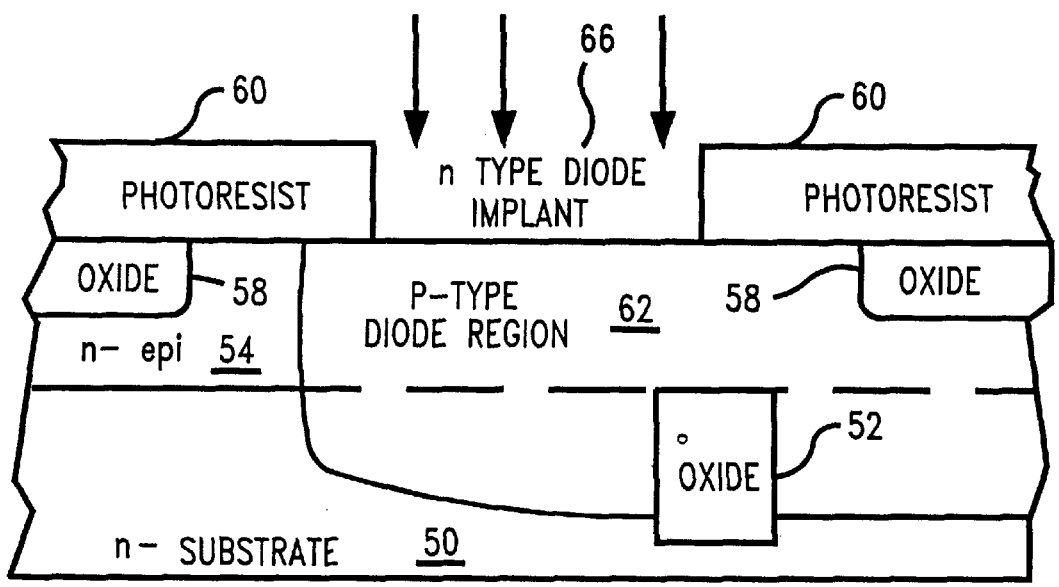
Figure 3H:
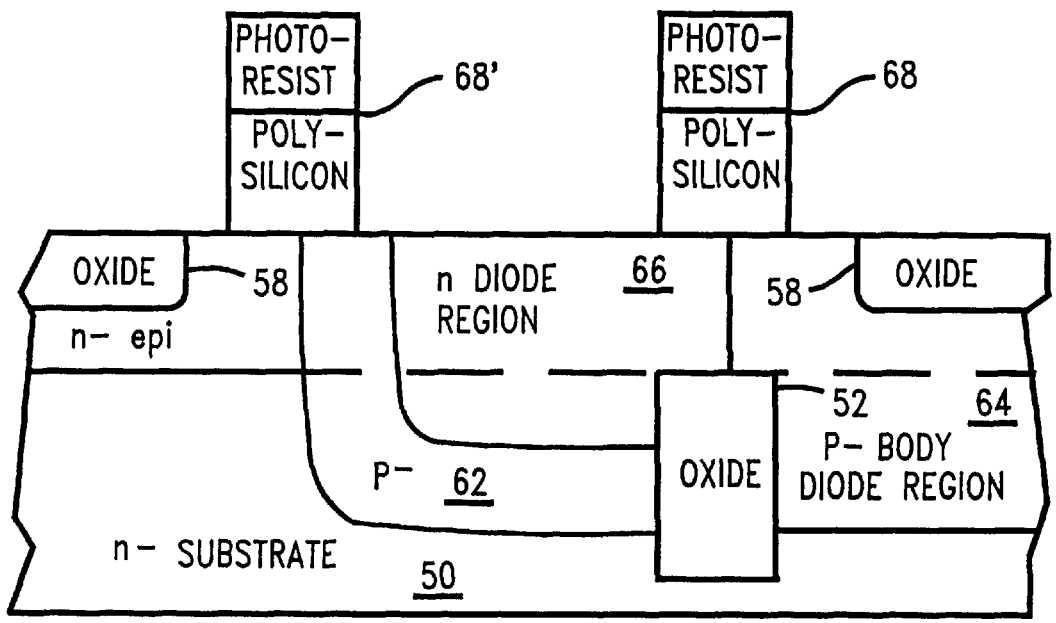
Figure 3I:
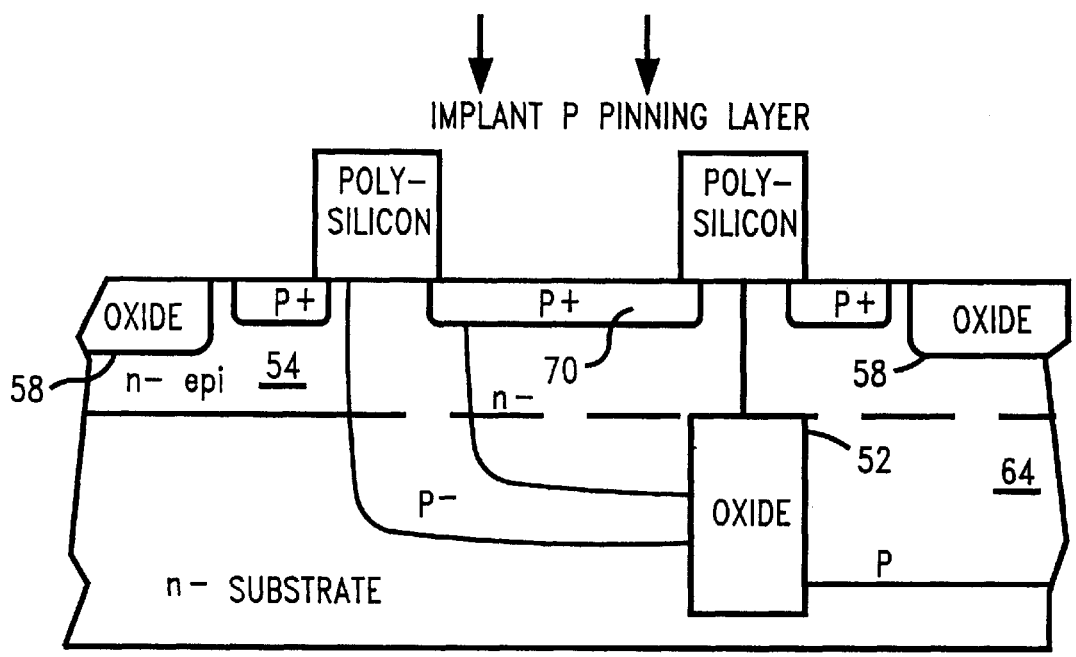
Figure 3J:
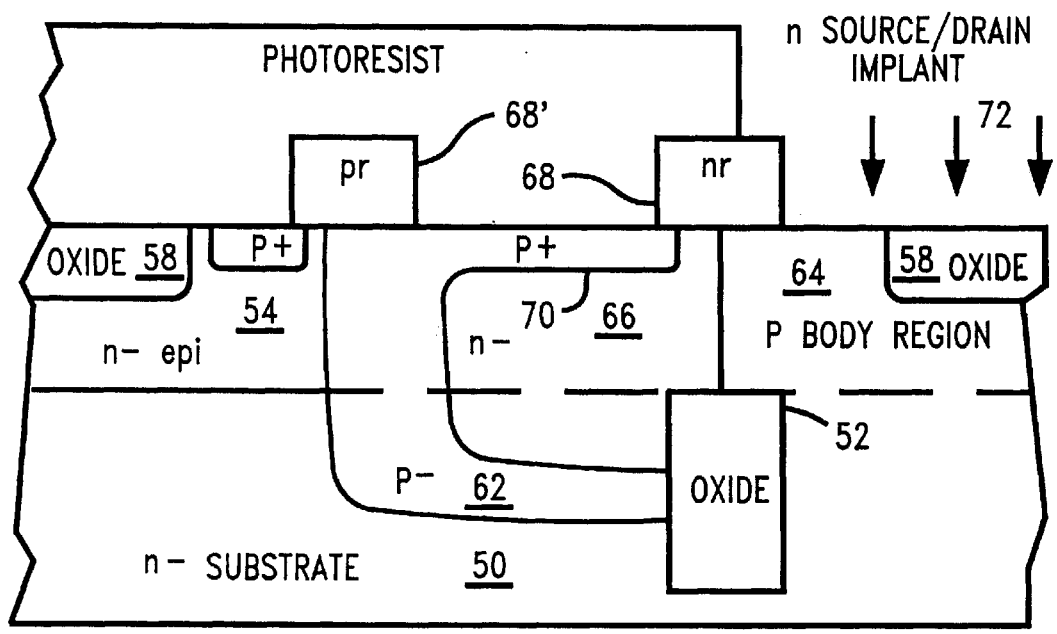
Figure 3K:
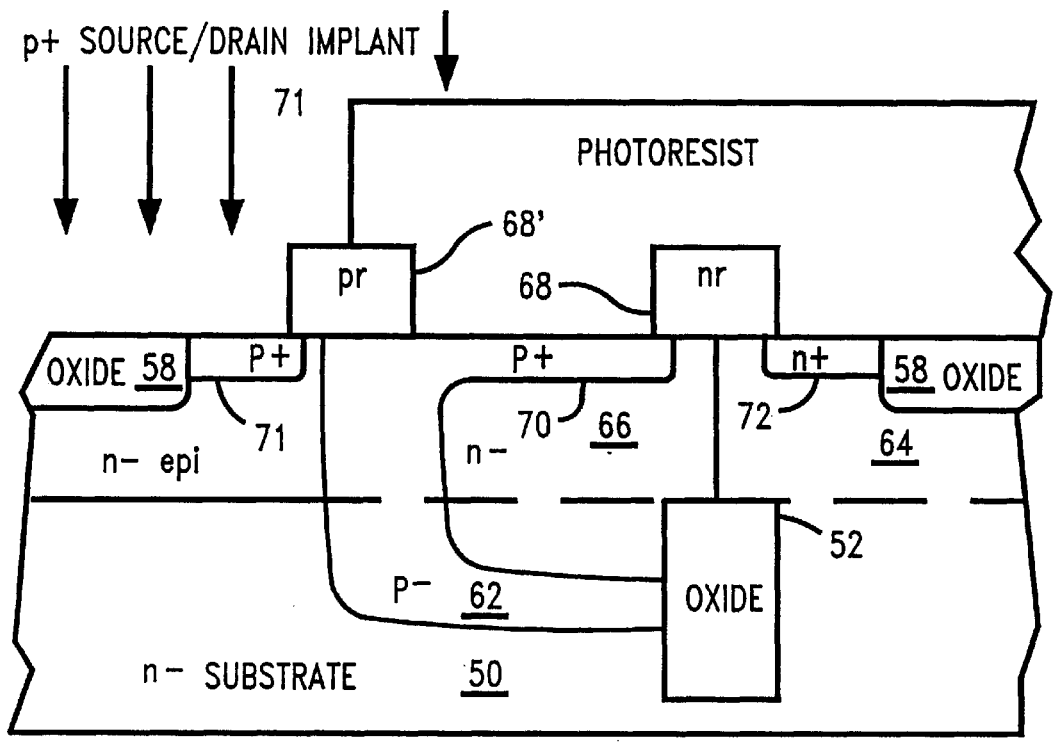
Figure 3L:
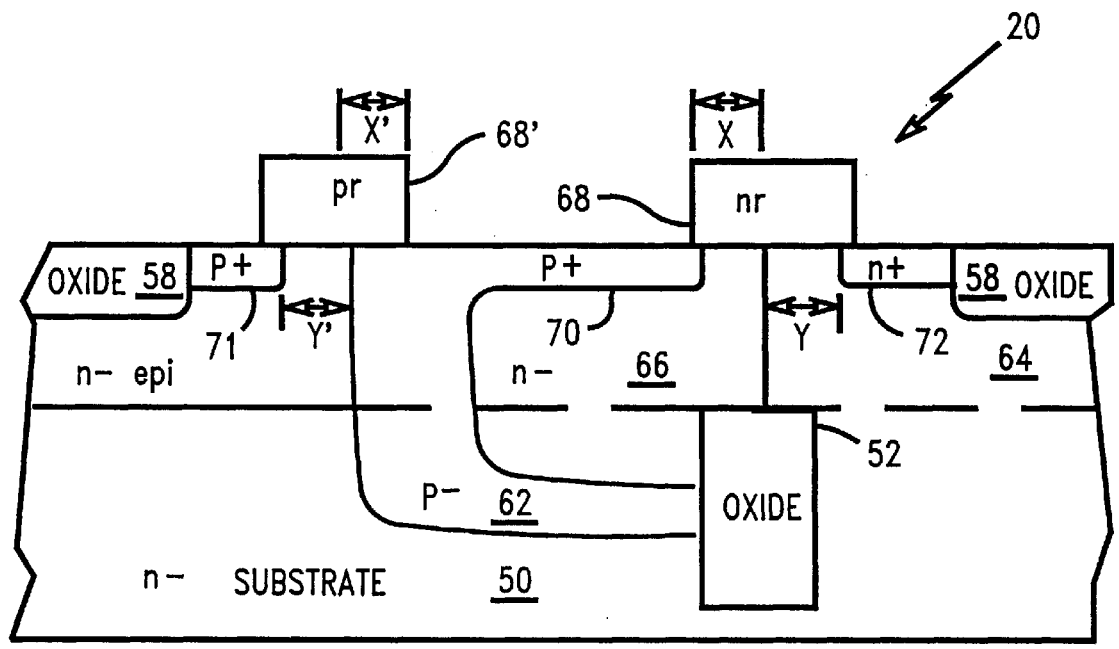

FIGS. 3a–j illustrate the steps for producing the complementary active pixel sensor cell 20 of the present invention. FIG. 3a illustrates an n-type wafer substrate 50. FIG. 3b illustrates a deep insulating region. The insulating region may be an isolation trench 52 formed in the n-substrate 50 by conventional methods and filled with oxide and polished to planarity. Alternately, the insulating region may be formed by a SIMOX (Separation by Implantation of Oxygen) process or other conventional method. FIG. 3c illustrates an n-epitaxy or n-epi layer 54 grown on a surface of the substrate and covering the deep isolation oxide. The preferred epitaxy is n doped and is formed by a process of depositing thin films of silicon single crystal onto a single crystal wafer substrate. A depression 56 forms in the n-epi layer 54 when it is grown over the oxide isolation; the depression 56 is polished in order to make the n-epi layer 54 planar. FIG. 3d illustrates the formation of shallow trench isolation 58 in the n-epi layer 54 by conventional methods. FIG. 3e illustrates the application of photoresist 60 on the surface of the n-epi layer 54 and a masked implantation of a deep p-type diode region 62. FIG. 3f illustrates a masked implantation of a P-body diode region 64. FIG. 3g illustrates a masked implantation of another n-type diode region 66 adjacent to the p-type diode region 62. FIG. 3h illustrates a standard gate definition step with application polysilicon and photoresist forming the n transfer and p transfer regions 68 and 68' respectively. FIG. 3i illustrates an implant of a p pinning layer 70. FIG. 3j illustrates the implantation of an n source/drain 72. FIG. 3k illustrates the implantation of a p source/drain 71. FIG. 3l illustrates the complementary active pixel sensor cell substrate 20 with p+ and n+ source regions. Fabrication of contacts and metalization can be performed on the substrate using conventional methods.

In order to create the device illustrated in FIG. 3l the n-substrate 50 should be doped to a level of approximately 1E15 and must be lightly-doped in order to facilitate counterdoping of p- region 62. The light doping is advantageous for large depletion regions and good light collection. Buried isolation 52 of 1 micron approximate thickness and width must be thick enough to prevent the p-region 62, p diode region 64 and n-region 66 from positioning above or below the buried isolation 52. The buried isolation 52 must be wide enough to accommodate a mask edge so as to facilitate alignment of implants. Shallow trench isolation 58 of 0.5 microns approximate thickness and width must be deep enough to contain heavy S/D (source/drain) implants 71 and 72. An n-epitaxy region 54 can be doped to approximately 1-5E15 with a thickness of approximately 3–4 microns. The region 54 should be thick enough to enable control of regions 62 and 64 while also establishing a threshold for gate 68'. Additionally, the use of n-doped polysilicon can increase the threshold of device 68' for a given doping level. The p-diode region 62 can be doped to approximately 1E16 and must extend into buried isolation 52, but not beyond region 52. Additionally, p-diode region 62 must extend laterally under gate 68'. A p-pinning layer 70 doped to approximately 1E17 should be doped as lightly as possible in order to create a shallow layer for good blue response. The layer 70 must be counter doped by regions 66 and 72. Further, layer 70 must be self-aligned with gates 68 and 68'. The p+ source/drain region 71 must be deep enough to eliminate leakage and shallow enough to be aligned to gate 68'. The region 71 must be blocked by a mask from regions 70 and 71. The PFET gate 68' must be wide enough to align with region 62 and must be wide enough to land a mask on for region 71. The distance x' must be greater than zero, and should be as small as possible. The distance y' must be large enough to shut off leakage current, and as small as possible to provide layout density and performance. The NFET gate 68 must be wide enough to land a mask on for region 72 and also wide enough to align to region 66. The distance x must be greater than zero and should be as small as possible. The distance y must be large enough to shut off leakage current, and as small as possible to provide layout density and performance.

Figure 4:
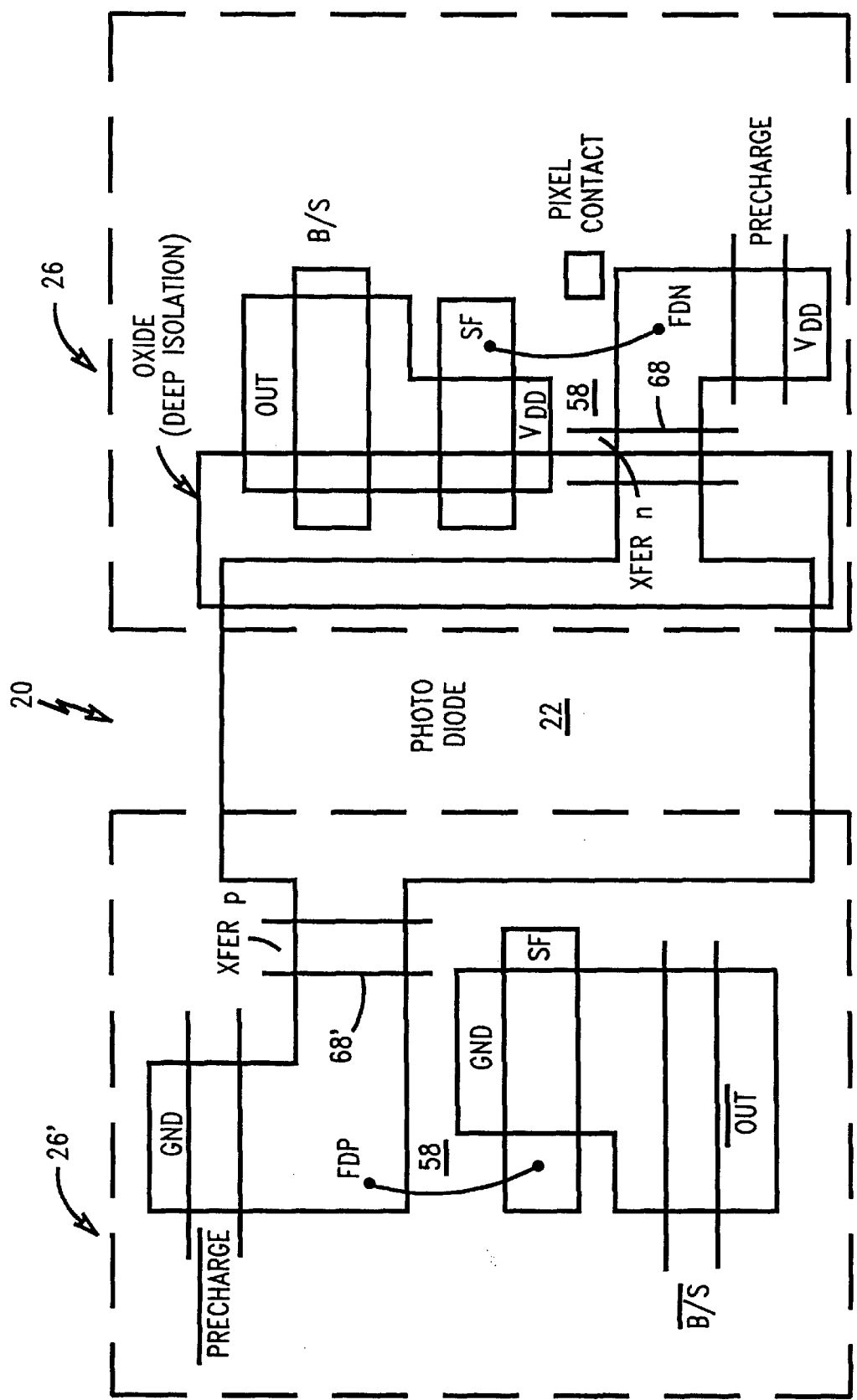
FIG. 4 is top view illustrating a configuration of the complementary active pixel sensor cell of the present invention.

FIG. 4 illustrates a top view of the preferred layout of the device 20 of FIG. 3j. Contacts and metalization are indicated schematically. The position of the first active pixel sensor circuit 26 and its complement circuit 26' is illustrated. The complementary active pixel sensor cell 20 may be configured so as to route the output signal and complementary output signal to respective differential amplifiers. True and complement control signals should be supplied to the first active pixel sensor circuit 26 and the second active pixel sensor circuit 26' respectively.

The structure of the active pixel sensor 20 consists of a p-well in an n-epi layer directly under an n-well and a p-epi region. A p-pinning layer is present at the surface of the n-well. The n-well and p-well are initialized to a positive and a negative potential respectively, and are typically depleted. Electrons generated in the wells are collected by the n-well, while the holes are collected by the p-well. Some holes generated in the n-epi are also collected. The cell can be constructed as explained above, though is not limited to that construction. Electrons are read via the n-well and n-type transistor, and the holes are read via the p-well and PFET transistor. The total output signal is the sum of the charge read from the NFET and PFET transistors.

Figure 1B:
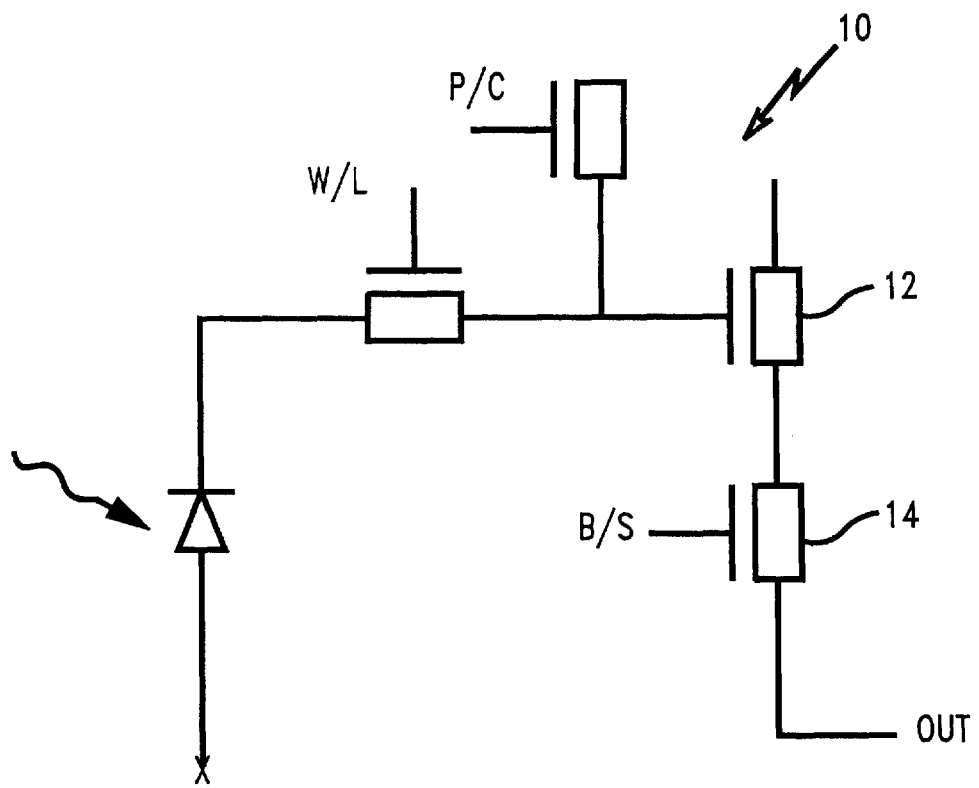

The magnitude of the difference between the output signal and the complementary output signal is approximately two times that of the prior art conventional active pixel sensor cell device 10 of FIGS. 1a and 1b and is produced from a similar photon flux and photon collection area. The additional signal will provide several advantages: 1) tracking the true and complement signals across the chip will improve common-mode noise rejection; 2) the additional signal may be used to improve the signal-to-noise ratio for a given photo collection area; 3) the additional signal may be used to reduce the collection area by approximately 50% in order to reduce the size of the active pixel sensor 20; and 4) the fixed pattern noise may be reduced by statistically averaging the electron signal from the NFET source-follower transistor and the hole signal from the PFET source-follower transistor. Since both the electrons and the holes can be collected and utilized in the circuit and complementary circuit, the size of the collection area 22 of the complementary active pixel sensor device 20 can be reduced by approximately 50% of the size of the collection area of the conventional sensor 10 while producing output of similar magnitude to the conventional sensor.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of making an active pixel sensor device comprising:
   a) providing a photosensitive device;
   b) providing a first device coupled to said photosensitive device, said first device comprising a first active pixel sensor circuit adapted to create a path for electron flow from said photosensitive device;
   c) providing a second device coupled to said photosensitive device, said second device comprising a second active pixel sensor circuit adapted to create a path for hole flow from said photosensitive device,
wherein in operation said photosensitive device generates charges in response to electromagnetism impinging on said photosensitive device, said first device drawing a first type of generated charge away from said photosensitive device and creating a first output signal, and said second device drawing a second type of generated charge from said photosensitive device and creating a second output signal opposite to the first output signal, the total output signal of the active pixel sensor device being the magnitude of the difference of the first and second output signals.

2. The method of claim 1 wherein said first, second and photosensitive devices are disposed in a substrate:
   said substrate having an isolation region and a diffusion region; and
   wherein said isolation region and said diffusion region isolate said photosensitive device from said substrate and said diffusion region comprises a terminal of said second device.

3. The method of claim 2 wherein a pinning layer is disposed in said diffusion region.

4. The method of claim 1 wherein said second active pixel sensor circuit is a complement of said first active pixel sensor circuit.

5. The method of claim 1 wherein said first active pixel sensor circuit comprises:
   a transfer device in series with said photosensitive device adapted to transfer electrons from said photosensitive device;
   a pre-charge device adapted to collect electrons which flow through said transfer device;
   a source-follower device adapted to amplify the electrons collected by said pre-charged device; and
   a bit switch device adapted to control an output signal.

6. The method of claim 1 wherein said second active pixel sensor circuit comprises:
   a complementary transfer device in series with said photosensitive device adapted to transfer holes from said photosensitive device;
   a complementary pre-charge device adapted to collect holes which flow through said complementary transfer device;
   a complementary source-follower device adapted to amplify the holes collected by said complementary pre-charged device; and
   a complementary bit switch device adapted to control a complementary output signal.

7. A method of making an active pixel sensor device comprising:
   a) providing a substrate having an isolation region and a diffusion region;

b) providing a photosensitive device disposed in said substrate, said isolation region and said diffusion region isolating said photosensitive device from said substrate;

c) providing a first device disposed in said substrate coupled to said photosensitive device, said first device comprising a first active pixel sensor circuit adapted to create a path for electron flow from said photosensitive device;

d) providing a second device disposed in said substrate coupled to said photosensitive device, said diffusion region comprising a terminal of said second device, said second device comprising a second active pixel sensor circuit adapted to create a path for hole flow from said photosensitive device, said second active pixel sensor circuit being a complement of said first active pixel sensor circuit, wherein in operation said photosensitive device generates charges in response to electromagnetism impinging on said photosensitive device, said first device drawing a first type of generated charge away from said photosensitive device and creating a first output signal, and said second device drawing a second type of generated charge from said photosensitive device and creating a second output signal approximately equal and opposite to the first output signal, the total output signal of the active pixel sensor device being the magnitude of the difference of the first and second output signals.

8. The method of claim 7 wherein a pinning layer is disposed in said diffusion region.

9. The method of claim 7 wherein said first active pixel sensor circuit comprises:
   a transfer device in series with said photosensitive device adapted to transfer electrons from said photosensitive device;
   a pre-charge device adapted to collect electrons which flow through said transfer device;
   a source-follower device adapted to amplify the electrons collected by said pre-charged device; and
   a bit switch device adapted to control an output signal.

10. The method of claim 9 wherein said second active pixel sensor circuit comprises:
   a complementary transfer device in series with said photosensitive device adapted to transfer holes from said photosensitive device;
   a complementary pre-charge device adapted to collect holes which flow through said complementary transfer device;
   a complementary source-follower device adapted to amplify the holes collected by said complementary pre-charged device; and
   a complementary bit switch device adapted to control a complementary output signal.

* * * * *